United States Patent [19]

Petersson

[11] Patent Number: 4,868,523

[45] Date of Patent: Sep. 19, 1989

[54] INTERMITTENT PHASE LOCKED LOOP FREQUENCY SYNTHESIZER FOR FREQUENCY HOPPING RADIO SYSTEM

[75] Inventor: Peter M. Petersson, Järfälla, Sweden

[73] Assignee: Telefonaktiebolaget L M Ericsson, Stockholm, Sweden

[21] Appl. No.: 209,624

[22] Filed: Jun. 21, 1988

[30] Foreign Application Priority Data

Aug. 13, 1987 [SE] Sweden ............................... 8703143

[51] Int. Cl.⁴ .............................................. H03L 7/18
[52] U.S. Cl. ...................................... 331/14; 331/25; 375/1
[58] Field of Search ................ 331/14, 25; 375/1, 2.1, 375/2.2, 120

[56] References Cited

U.S. PATENT DOCUMENTS

| | | | |
|---|---|---|---|
| 4,625,180 | 11/1986 | Itaya et al. | 331/14 X |
| 4,654,859 | 3/1987 | Kung et al. | 375/1 |
| 4,667,169 | 5/1987 | Matsuura et al. | 331/14 |

FOREIGN PATENT DOCUMENTS 0186854  7/1986  European Pat. Off.
2091960  8/1982  United Kingdom.

Primary Examiner—Siegfried H. Grimm
Attorney, Agent, or Firm—Burns, Doane, Swecker & Mathis

[57] ABSTRACT

A frequency synthesizing apparatus comprising a reference generator (1) and a phase locked loop containing a phase detector (3) of the sample-hold type, a loop filter (4) a VCO (5) and a frequency divider (6) in the loop. The frequency divider (6) can be set at different numbers (N) so that the VCO sends different frequencies. In accordance with the invention a synchronizing unit (2) is connected between the reference generator (1) and the phase detector (3). The synchronizing unit switches reference generator (1) and the frequency divider means simultaneously to the phase locked loop during the locking phase and switches these out during a working phase, when the VCO (5) sends an output signal of the desired frequency (f). The loop filter can then be dimensioned with a wide bandwidth for rapid locking.

2 Claims, 2 Drawing Sheets

INTERMITTENT PHASE LOCKED LOOP FREQUENCY SYNTHESIZER FOR FREQUENCY HOPPING RADIO SYSTEM

TECHNICAL FIELD

The present invention relates to an apparatus for frequency synthesis, i.e. an apparatus generating a signal which can assume different frequencies. More specifically, there is intended a frequency synthesis apparatus which hops to different frequencies in intermittent operation. An apparatus of this kind is used in such as mobile radio transmitters for frequency hopping.

BACKGROUND ART

Apparatus of the kind mentioned above are already known to a certain extent, see EP-A No. 2 0186 854, (U.S. Pat. No. 4,625,180) for example. This known frequency synthesis apparatus operates intermittently for saving power, as with the present apparatus. In the known apparatus, there is a phase locked loop which is switched in or out. Three switches have been arranged to avoid frequency instability in the synthesizer, this instability being caused by phase uncertainty between the reference frequency and the output frequency of the voltage controlled oscillator. One of the switches is a power switch for switching in and out a supply source to the frequency divider for intermittent operation. The second and third switches switch in and out the reference generator and the frequency divider to the phase comparator in the loop, respectively.

This known frequency synthesizer operates intermittently but gives a continuous output signal.

DISCLOSURE OF THE INVENTION

The present invention relates to an apparatus for frequency synthesis, which similar to the one known operates intermittently, but which is to give an output signal in bursts with a given timing. Each burst contains a given carrying frequency, the value of which is retained substantially constant during a given number of bursts. After this number of bursts there is a hop to a new frequency, and an output signal is sent in bursts with the new carrier frequency.

The idea in accordance with the present invention is to utilize the intermittent operation by achieving rapid locking of the phase loop in the time interval between two bursts, when no carrier frequency needs to be sent. Locking either takes place at the same frequency as in a previous burst or at a new frequency in the subsequent burst. The phase locked loop can be dimensioned entirely without consideration to the leak normally occuring from the reference generator to the voltage controlled oscillator VCO, since the later is disconnected from the reference generator during the burst interval. When the loop is locked, which takes place during a pause betwen the bursts and just before the bursts begin, the control voltage of the VCO is frozen and kept fixed during the entire burst. This means that other current consuming circuits (primarily parts of the circuit in the phase locked loop) can be also disconnected during the interval when the VCO is disconnected. The phase locked loop is initiated in time for the next burst, when the VCO is rapidly set to the right frequency. The locking process can be further accelerated by the included frequency divider being set to zero at the beginning of the process.

The object of the present invention is to achieve an apparatus for frequency synthesis which contains a phase locked loop, and which gives an output signal in bursts with a given carrier frequency and which utilizes the time intervals between two bursts for rapid locking of the loop, so that a stable and noise-free signal is obtained during the bursts itself, as well as saving current by intermittent operation.

The apparatus is characterized by the disclosures in the characterizing portion of claim 1.

BRIEF DESCRIPTION OF DRAWINGS

The apparatus in accordance with the invention will now be described in more detail with reference to the accompanying drawings, where.

BEST MODES FOR CARRYING OUT THE INVENTION

Figure 1:
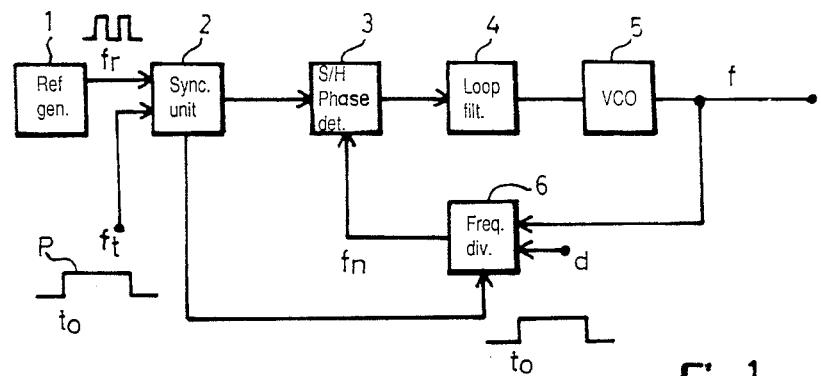
FIG. 1 is a block diagram of an apparatus in accordance with the invention.

Only the parts essential to the invention have been illustrated in the block diagram according to FIG. 1. A reference generator 1 sends a pulse- or sinus-shaped signal, the frequency $f_r$ of which is stable and of the order of magnitude 150 kHz. The generator 1 may be a crystal oscillator, for example. The generator frequency $f_r$ is the reference for the carrier frequency which is to be sent in bursts from the synthesizing apparatus.

The block 2 is a synchronizing unit which intermittently and with a given timing connects the reference frequency $f_r$ to a phase detector 3 of the sample-hold type, which gives a level with a magnitude responsive to the phase difference between both signals coming to the phase detector, as will be described in more detail with reference to FIG. 3. The synchronizing unit 2 is controlled by a pulse train P with a repetition frequency $f_t$ = the timing frequency. The pulse train P is shown in more detail in FIG. 2a. During the time interval $t_0$–$t_1$ the pulse is "high" ("the locking phase") and the reference frequency $f_r$ is connected to the phase detector 3. During the time interval $t_1$–$t_2$ the pulse is "low" ("workig phase") and the phase detector 3 is disconnected from the reference generator 1. The pulse train P does not need to be periodic.

The phase detector 3 is conventionally connected to a loop filter 4 and to a voltage controlled oscillator 5 (VCO). The output of the VCO 5 is connected to a controllable divider unti 6, which is intermittently controlled according to the above from the synchronizing unit 2. The divider unit 6 sends a downwardly divided frequency to the second input of the phase detector 3.

The divider unit 6 can be set via an input d so that it divides the frequency $f=f_1$ of the output signal of the VCO 5 by different values N, the frequency $f_n$ of the output signal then being $f_1/N$. The phase of the output signal is compared in the phase detector with the phase of the reference signal. The division factor N is altered at the time $t_6$ in FIG. 2 when there is to be a hop to another output frequency $f=f_2$. During the locking phase ($t_6$–$t_7$ in FIG. 2) the loop 3,4,5,6 is phase locked to the reference signal phase. For example, the output frequency is f=900 MHz and N=6000, $f_n$ then being = 150 kHz.

The loop filter 4 comprises a lowpass filter, with a band limit which does not lie at a low frequency relative the reference frequency for blocking this frequency, as with already known phase locked loops, but can have a higher band limit (with a bandwidth of the order of magnitude 10–100 times as wide), whereby a more rapid phase lock is achieved during the locking interval. Since the loop is disconnected during the working phase (no reference signal to the phase detector 3, the divider unit 6 disconnected) there is no leakage of the low frequency signal $f_n$ and/or the reference signal to the VCO 5. This oscillator operates entirely independently during the working phase. The phase locked loop 3,4,5,6 can thus be dimensioned entirely without consideration to the leakage ("spurious") to obtain the most rapid frequency adjustment conceivable.

A special frequency divider, a so-called prescaler, can precede the frequency divider 6 for synthesizers intended for a high carrier frequency. The prescaler is intended for high frequencies, and in cases whereby they are not presetable, enabling them to be set to a given position when the supply voltage is switched on, the zero setting can be replaced with zero setting of the frequency divider 6 simultaneously as the prescaler passes its zero position. This reduces the initial phase error and partly replaces the advantage zero setting of all dividers would have been.

Figure 2:
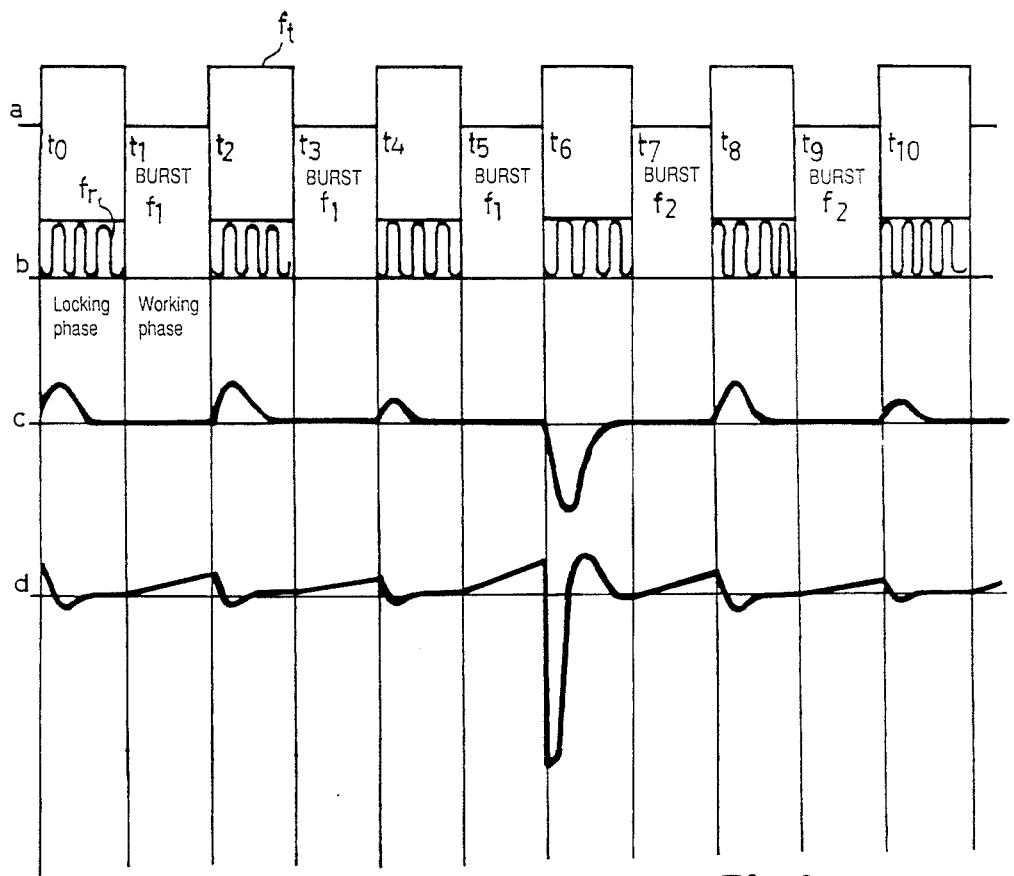
FIG. 2 is a time chart for certain signals occuring in the apparatus according to FIG. 1.

FIG. 2 is a time chart more closely describing the modus operandi of the apparatus according to FIG. 1.

During the interval $t_0$–$t_1$ the reference generator 1 is connected to the phase detector 3 and the frequency divider 6 is switched into the loop. A burst is obtained with the reference frequency $f_r$ to one input of the phase detector (see FIG. 2b). FIG. 2c schematically illustrates the output signal from the phase detector, this signal first rising during the locking process and thereafter falling to a given value, which is constant for the rest of the interval $t_0$–$t_1$, and which denotes that locking has taken place. This value is also kept constant during the subsequent working phase $t_1$–$t_2$ when the reference generator 1 and frequency divider 6 (i.e. the loop) are disconnected. During the interval $t_1$–$t_2$ the VCO 5 sends a high frequency burst with the frequency $f=f_1$. This frequency varies somewhat, however, dependent on the drive of the VCO 5. FIG. 2d illustrates the error which is obtained during the different intervals. Since the working phase $t_1$–$t_2$ is very short this error can be kept small.

A hop to another frequency $f=f_2$ takes place at the time $t_6$ by the division factor N being altered. The output signal from the phase detector 3 is then altered to a higher (negative) value than during preceding locking phases, and the frequency error according to FIG. 2d will be great. Since the loop has a wide bandwidth there is a rapid lock to the new frequency $f=f_2$.

Figure 3:
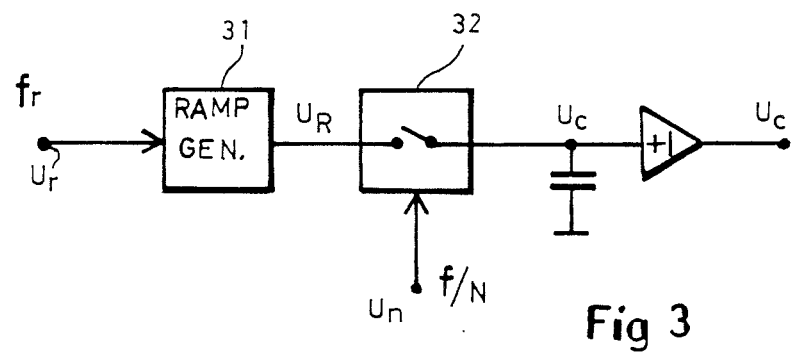
FIG. 3 is a simplified block diagram of a phase detector included in the apparatus according to FIG. 1.
Figure 4:
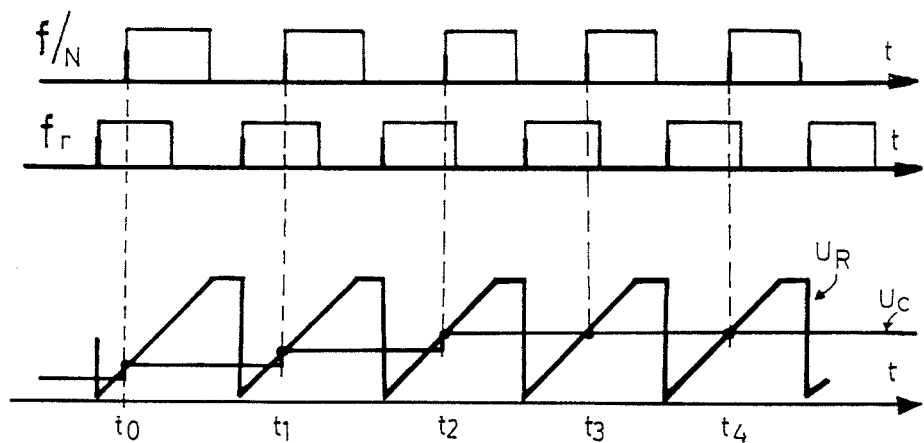
FIG. 4 is a time chart for the phase detector according to FIG. 3.

Turning now to FIGS. 3 and 4, the phase detector 3 will be described in more detail. This comprises, according to FIG. 3, a ramp generator 31 receiving the reference signal $U_r$ from the synchronizing unit 2 during the locking phase, and delivers a trapezium shaped signal $U_R$ to a sampling unit 32. This unit is controlled by the signal $U_n$ from the divider unit 6 such that the leading flank of the pulse train $U_n$ freezes the value on the ramp $U_R$ according to FIG. 4. The value $U_c$ which is then obtained constitutes the holding value, and remains on the output of the unit 32 until the next leading flank of the pulse train $U_n$ occurs.

The pulse train $U_r$ has the repetition frequency $f_r$ and the pulse train $U_n$ has the repetition frequency $f/N$, where f is the output frequency from the VCO 5. The pulse train $U_n$ from the frequency divider shall be phase locked to the phase of the reference pulse train $U_r$. The ramp voltage is therefore sampled by the pulse train $U_n$ to give a control voltage $U_c$, which is supplied to the VCO 5 after filtering in the loop filter 4 to control the frequency f of the VCO.

At $t=t_0$ according to FIG. 4, there is obtained a certain phase error between the pulse trains $U_n$ and $U_r$, and the control voltage (level) of $U_c$ is increased so that the VCO 5 sends a signal with somewhat changed frequency f, which after division by the factor N is changed somewhat, but not so much that a new error is once again obtained at $t=t_1$. The control voltage level is once again changed and the obtained pulse train $U_n$ has a changed frequency. At $t=t_3$ it is assumed that this frequency has been changed so that the phase error has been stabilized around 0. The control voltage level is therefore locked during the subsequent time interval. The output frequency has thus been locked to the reference frequency phase. It should be noted that the times $t_1, t_2 \ldots$ in FIG. 4 are not the same as those in FIG. 2, since the phase lock is taking place during the locking phase, e.g. the time interval $t_0$–$t_1$ in FIG. 2.

The locking phase can thus be shortened with the proposed synthesizing apparatus, simultaneously as noise from the reference frequency does not effect the VCO during the working phase.

I claim:

1. Apparatus for frequency synthesis for use in a radio system for frequency hopping with the purpose of generating a useful signal of definite frequency and phase during a given first part interval of the period time of a timing signal (P), including a reference generator (1) for generating a reference signal with a given reference frequency ($f_r$) and phase; a phase locked loop comprising a voltage controlled oscillator (5) sending a given variable frequency (f); a frequency divider unit (6) arranged in the loop so as to divide the frequency (f) of the output signal from the oscillator by a given number (N) and for sending a signal with a frequency ($f_n$) having a value close to said reference frequency; a phase detector (3) for sending a difference signal corresponding to the phase difference between the reference frequency signal and the signal from the divider unit (6); and a loop filter (4) for receiving said difference signal and providing a control signal which controls the frequency from said voltage controlled oscillator (5), characterized in that a control and synchronizing unit (2) responsive to said timing signal P is arranged to synchronously switch in the frequency divider unit (6) and reference generator (1) during a first time interval ($t_0$–$t_1$), when said useful signal is not generated, for locking the output signal phase to the reference signal phase, and for switching out the frequency divider unit (6) and reference generator (1) during a second time interval ($t_1$–$t_2$) when the useful signal is to be generated, the loop filter (4) having an upper band limit selected substantially greater than the frequency which would have been the result of an acceptable noise level in a continuously operating synthesizer, and is instead selected for giving rapid locking during said first time interval ($t_0$–$t_1$) of the phase locked loop.

2. Apparatus as claimed in claim 1, characterized in that said phase detector (3) is of the sample-and-hold type which is controlled by the output signal from said frequency divider unit (6) in order to create a determined signal value ($U_c$) in said first time interval ($t_0$–$t_1$) to the voltage controlled oscillator (5) and to hold said determined signal value during said first time interval, said oscillator (5) giving an output signal (f) whose phase is locked to the phase of said reference signal ($f_r$).

* * * * *